United States Patent
Itoh et al.

(10) Patent No.: US 10,141,047 B2
(45) Date of Patent: Nov. 27, 2018

(54) STATIC RANDOM ACCESS MEMORY

(71) Applicant: Commissariat à l'Energie Atomique et aux Energies Alternatives, Paris (FR)

(72) Inventors: Kiyoo Itoh, Tokyo (JP); Amara Amara, Sceaux (FR); Khaja Ahmad Shaik, Issy-les-Moulineaux (FR)

(73) Assignee: COMMISSARIAT A L'ENERGIE ATOMIQUE ET AUX ENERGIES, Paris (FR)

( * ) Notice: Subject to any disclaimer, the term of this patent is extended or adjusted under 35 U.S.C. 154(b) by 374 days.

(21) Appl. No.: 15/160,968

(22) Filed: May 20, 2016

(65) Prior Publication Data
US 2016/0372180 A1 Dec. 22, 2016

(30) Foreign Application Priority Data
May 22, 2015 (FR) ...................... 15 54654

(51) Int. Cl.
| | |
|---|---|
| *G11C 11/412* | (2006.01) |
| *G11C 11/419* | (2006.01) |
| G11C 5/14 | (2006.01) |
| G11C 7/12 | (2006.01) |

(52) U.S. Cl.
CPC .......... *G11C 11/419* (2013.01); *G11C 11/412* (2013.01); *G11C 5/14* (2013.01); *G11C 7/12* (2013.01)

(58) Field of Classification Search
CPC .......................... G11C 11/41–11/419
USPC ................................. 365/154, 226
See application file for complete search history.

(56) References Cited

U.S. PATENT DOCUMENTS

| | | | |
|---|---|---|---|
| 6,781,870 B1 | 8/2004 | Kushida | |
| 8,559,212 B2* | 10/2013 | Huang | G11C 7/20 |
| | | | 365/154 |
| 2004/0246805 A1* | 12/2004 | Nii | G11C 5/14 |
| | | | 365/226 |
| 2007/0274124 A1* | 11/2007 | Otsuka | G11C 11/417 |
| | | | 365/154 |
| 2008/0158938 A1 | 7/2008 | Burnett et al. | |
| 2011/0235406 A1 | 9/2011 | Jung et al. | |

(Continued)

OTHER PUBLICATIONS

Nalam et al.; "Asymmetric Sizing in a 45 nm 5T SRAM to Improve Read Stability over 6T"; Year: 2009; IEEE 2009 Custom Integrated Circuits Conference (CICC); pp. 709-712.

(Continued)

*Primary Examiner* — Han Yang
(74) *Attorney, Agent, or Firm* — Moreno Intellectual Property Law LLC

(57) ABSTRACT

A static random access memory (SRAM) comprises a plurality of memory cells each having a pair of cross-coupled inverters, a first of the inverters being supplied by first and second power supply rails and a second of the inverters being supplied by third and fourth supply rails, an input of the second inverter being coupled to a first bit line via a first transistor; and a power supply circuit adapted to apply a first voltage difference across the first and second power supply rails and a second voltage difference across the third and fourth power supply rails, the second voltage difference being greater than the first voltage difference.

14 Claims, 8 Drawing Sheets

(56) References Cited

U.S. PATENT DOCUMENTS

2012/0008377 A1 1/2012 Chuang et al.
2013/0314977 A1 11/2013 Wang et al.

OTHER PUBLICATIONS

Tran, Hiep; "Demonstration of 5T SRAM and 6T Dual-Port RAM Cell Arrays"; Year: 1996; 1996 Symposium on VLSI Circuits Digest of Technical Papers; pp. 68-69.

* cited by examiner

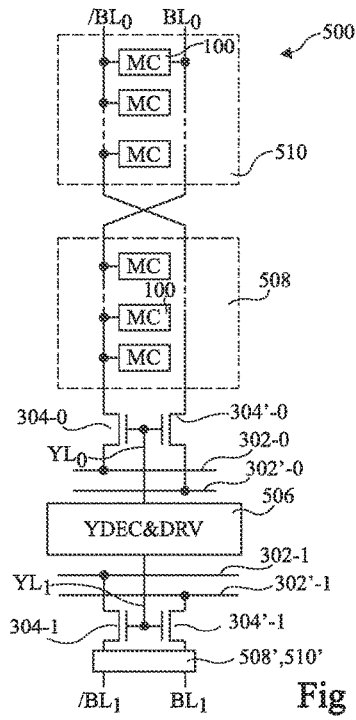
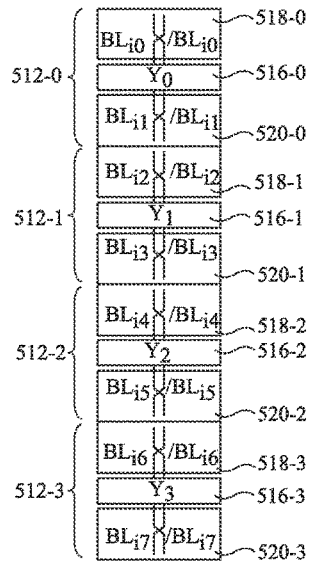
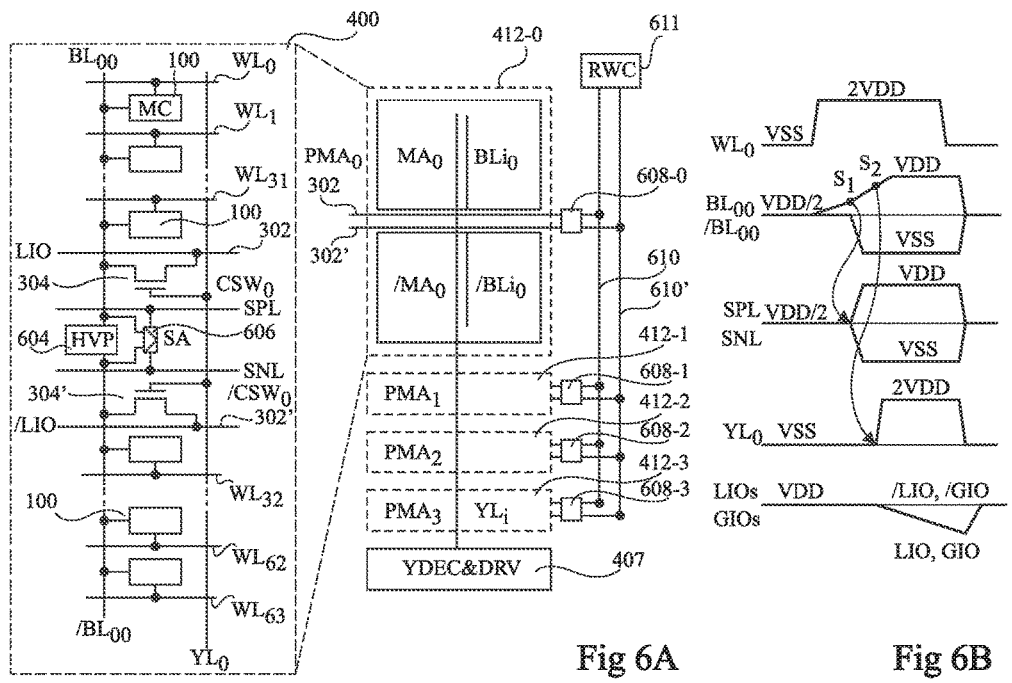
Fig 5A  Fig 5B
Fig 6A  Fig 6B

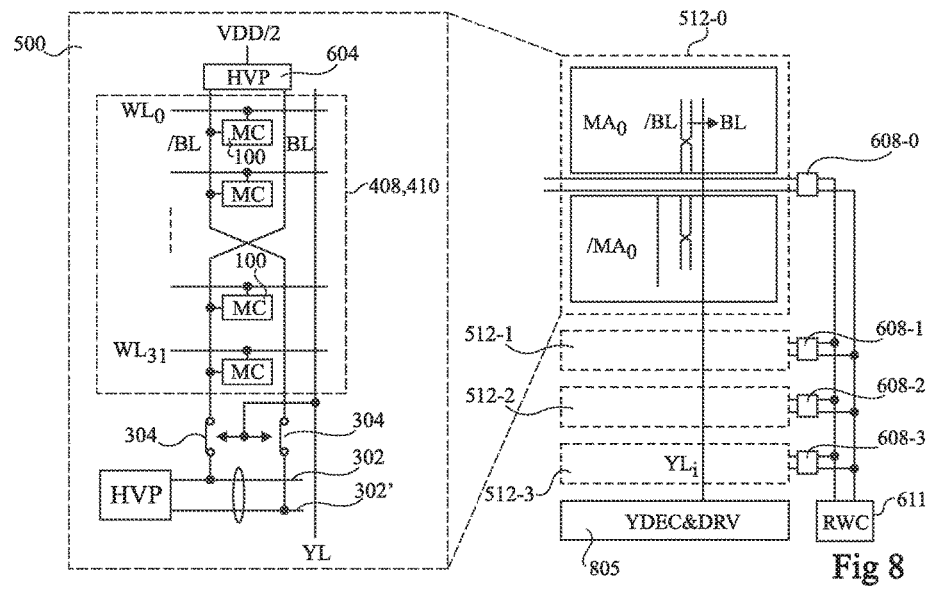
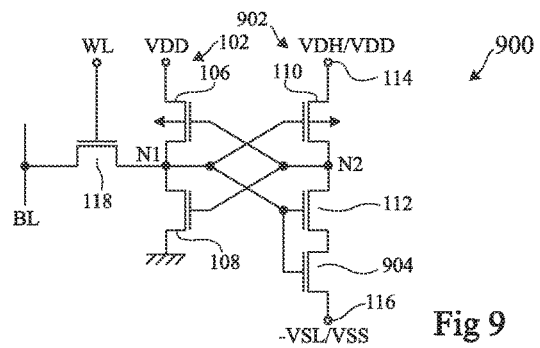
Fig 9
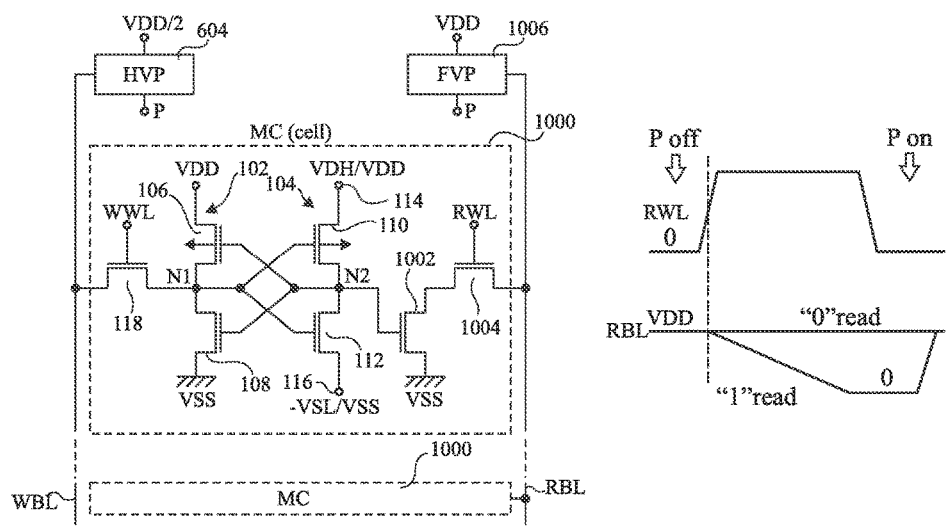
Fig 10A  Fig 10B

STATIC RANDOM ACCESS MEMORY

FIELD

The present disclosure relates to the field of static random access memories (SRAMs), and in particular to an SRAM and method of boosting the performance of an SRAM cell.

BACKGROUND

In an SRAM with conventional six-transistor memory cells (6T cells) based on MOSFET technology, each SRAM cell is coupled between a pair of complementary bit lines (BL), this being known as a folded-BL arrangement. The 6T cell comprises a pair of cross-coupled inverters forming a flip-flop, and transfer transistors controlled by a word line (WL) that respectively connect the flip-flop to the bit lines. The inverters are powered by a supply voltage VDD, and the WL is activated by a VDD-pulse.

There is a move in the industry towards using reduced VDD supply voltages of 0.5 V or less. However, the conventional 6T cell is not well adapted to such a supply voltage reduction. Indeed, the read operation of each cell degrades rapidly as VDD is reduced due to ever-decreasing current-driving capability, in other words the gate-over-drive (GOD) of each transistor in the cell. The GOD is defined as the subtraction of the threshold voltage Vt from the source-gate voltage VGS, and can be expressed as VDD Vt. The threshold voltage Vt of the transistors forming the inverters is generally larger than a typical Vt of 0.4 V to ensure low subthreshold leakage current. Thus there is a speed degradation as the level of VDD supplying the flip-flop and the word line approaches 0.4 V. Furthermore, even larger Vt variations of MOSFETs with the reduction in device dimensions make the situation worse.

To overcome some of these drawbacks, a single-ended 5T cell suitable for an open-BL arrangement has been proposed in the publication by I. Carlson et al. entitled "A high density, low leakage, 5T SRAM for embedded caches", Proc. 30th European Solid State Circuits Conf. (ESSCIRC), pp. 215-218, 2004, the contents of which is hereby incorporated by reference to the extent permitted by the law. However, such a cell continues to have reduced speed as VDD is reduced. This is because the flip-flop in the cell operates at VDD.

A further problem in existing SRAM cells is the array power dissipation, which is particularly high because operations involve pre-charging the bit lines to the full VDD voltage, leading to a full VDD voltage swing on many of the bit lines. Thus with a typical BL capacitance (CB) of 20-30 fF even for devices as small as 28 nm, the array power dissipation tends to be high. In order to reduce CB by allowing a shorter BL length, a so-called thin-cell has been proposed in a publication by K. Ishibashi and K. Osada entitled "Low Power and Reliable SRAM Memory Cell and Array Design", Springer, 2012, the contents of which is hereby incorporated by reference to the extent permitted by the law. In such a thin cell, the height of each cell in the bit line direction is lower than its width. However, CB is still relatively large.

There is a need in the art for an SRAM that addresses one or more of the above problems.

SUMMARY

It is an aim of embodiments of the present disclosure to at least partially address one or more needs in the prior art.

According to one aspect, there is provided a static random access memory (SRAM) comprising: a plurality of memory cells each having a pair of cross-coupled inverters, a first of the inverters being supplied by first and second power supply rails and a second of the inverters being supplied by third and fourth supply rails, an input of the second inverter being coupled to a first bit line via a first transistor; and a power supply circuit adapted to apply a first voltage difference across the first and second power supply rails and a second voltage difference across the third and fourth power supply rails, the second voltage difference being greater than the first voltage difference.

According to one embodiment, the power supply circuit is adapted to apply first, second, third and fourth voltages to the first, second, third and fourth power supply rails respectively, wherein the third voltage is higher than the first voltage, and the fourth voltage is lower than the second voltage.

According to one embodiment, the SRAM further comprises a bit line pre-charge circuit adapted to generate a pre-charge voltage for pre-charging the first bit line, the pre-charge voltage being within 10 percent of the intermediate level between the first and second voltages.

According to one embodiment, the SRAM further comprises a word line activation circuit adapted to render conductive the first transistor of a plurality of the memory cells by applying a fifth voltage to a control node of the first transistor, the fifth voltage being higher than the first and second voltages.

According to one embodiment, the power supply circuit is adapted to apply the second voltage difference across the third and fourth power supply rails of a first of the memory cells during an active mode of the first memory cell, and to apply a voltage lower than the second voltage difference across the third and fourth power supply rails during a standby mode of the first memory cell.

According to one embodiment, the power supply circuit comprises a plurality of power control circuits, a first of the power control circuits being coupled to the third and fourth power supply rails of the first memory cell, and a second of the power control circuits being coupled to the third and fourth power supply rails of a second of the memory cells, and wherein the power supply circuit is adapted to control the voltage difference applied across the third and fourth power supply rails based on one or more signals indicating when a portion of the SRAM comprising the first memory cell is selected to be the object of a read or write operation.

According to one embodiment, the SRAM further comprises: a memory cell block comprising a first plurality of the memory cells, each memory cell of the first plurality being coupled to the first bit line, the first bit line being coupled to a first input/output line of the memory cell block via a first switch controlled by a selection signal provided on a selection line.

According to one embodiment, the first plurality of memory cells form a column, the first bit line being formed along a first side of the column, and the selection line being positioned along a second side of the column opposite to the first side.

According to one embodiment, the memory cell block further comprises a second plurality of the memory cells, each memory cell of the second plurality being coupled to a second bit line, wherein the second bit line is coupled to a second input/output line of the memory cell block via a second switch.

According to one embodiment, the SRAM further comprises: a first sub-array comprising a first of said memory cell blocks; and a second sub-array comprising a second of said memory cell blocks, the first switch of each of the first and second memory cell blocks being controlled by the selection signal provided on said selection line.

According to one embodiment, the SRAM further comprises: a first sub-array comprising a plurality of the memory cells; a second sub-array comprising a further plurality of the memory cells; and one or more power supply circuits adapted to perform a partial activation of the SRAM by applying the second voltage difference to the memory cells of the first sub-array and applying a voltage lower than the second voltage difference to the memory cells of the second sub-array.

According to one embodiment, the first inverter comprises first and second transistors coupled in series via their main conducting nodes between the first and second power supply rails; the second inverter comprises first and second transistors coupled in series via their main conducting nodes between the third and fourth power supply rails; and the threshold voltage of the first transistor of the second inverter is higher than the threshold voltage of the first transistor of the first inverter, and/or the threshold voltage of the second transistor of the second inverter is higher than the threshold voltage of the second transistor of the first inverter.

According to one embodiment, the second inverter comprises first, second and third transistors coupled in series via their main conducting nodes between the third and fourth power supply rails, the first and second transistors or second and third transistors having their control nodes coupled together.

According to one embodiment, each SRAM cell further comprises a third and fourth transistors coupled in series by their main conducting nodes between the second power supply rail and a further bit line, a control node of the third transistor being coupled to an output of the second inverter, and wherein the SRAM further comprises a control circuit adapted to activate the first transistor of a first memory cell during a write operation to the first memory cell, and to activate the fourth transistor of the first memory cell during a read operation of the first memory cell.

According to a further aspect, there is provided a method of reading data from a memory cell of a static random access memory, the SRAM comprising a plurality of memory cells each having a pair of cross-coupled inverters, a first of the inverters being supplied by first and second power supply rails and a second of the inverters being supplied by third and fourth supply rails, an input of the second inverter being coupled to a first bit line via a first transistor, the method comprising: applying, during a read phase, a first voltage difference across the first and second power supply rails and a second voltage difference across the third and fourth power supply rails, the second voltage difference being greater than the first voltage difference.

According to a further aspect, there is provided a static random access memory (SRAM) comprising a first column of memory cells comprising: a first memory cell block comprising a plurality of first memory cells of the first column, each first memory cell being coupled to a first bit line, the first memory cells for example being 5T or 6T memory cells, and wherein the first bit line is coupled to a first input/output line via a first selection transistor; a second memory cell block comprising a plurality of second memory cells each being coupled to a second bit line, the second memory cells for example being 5T or 6T memory cells, wherein the second bit line is coupled to a second input/ output line via a second selection transistor; and a selection line coupled to control nodes of the first and second selection transistors.

According to another embodiment, the first and second output lines are each coupled via a further switch to a first global input/output line.

BRIEF DESCRIPTION OF THE DRAWINGS

The foregoing and other features and advantages will become apparent from the following detailed description of embodiments, given by way of illustration and not limitation with reference to the accompanying drawings, in which:

FIG. 5A schematically illustrates a memory cell block of a column of an SRAM according to yet a further example embodiment;

FIG. 5B schematically illustrates an SRAM comprising a plurality of SRAM sub-arrays based on the memory cell block of FIG. 5A according to yet a further example embodiment;

FIG. 6A schematically illustrates an SRAM in more detail according to an example embodiment;

FIG. 6B is a timing diagram illustrating an example of signals in the SRAM of FIG. 6A according to an example embodiment;

FIG. 8 schematically illustrates an SRAM according to yet a further example embodiment;

FIG. 9 schematically illustrates an SRAM cell according to a further example embodiment of the present disclosure;

FIG. 10A schematically illustrates an SRAM cell according to yet a further example embodiment of the present disclosure;

FIG. 10B is a timing diagram illustrating an example of signals in the SRAM of FIG. 10A according to an example embodiment.

DETAILED DESCRIPTION OF THE PRESENT EMBODIMENTS

Throughout the present description, the term "connected" is used to designate a direct connection between two elements, whereas the term "coupled" is used to designate a connection between two elements that may be direct, or may be via one or more other components such as resistors, capacitors or transistors. Furthermore, as used herein, the term "substantially" is used to designate a range of +/−10 percent of the value in question.

Figure 1A:
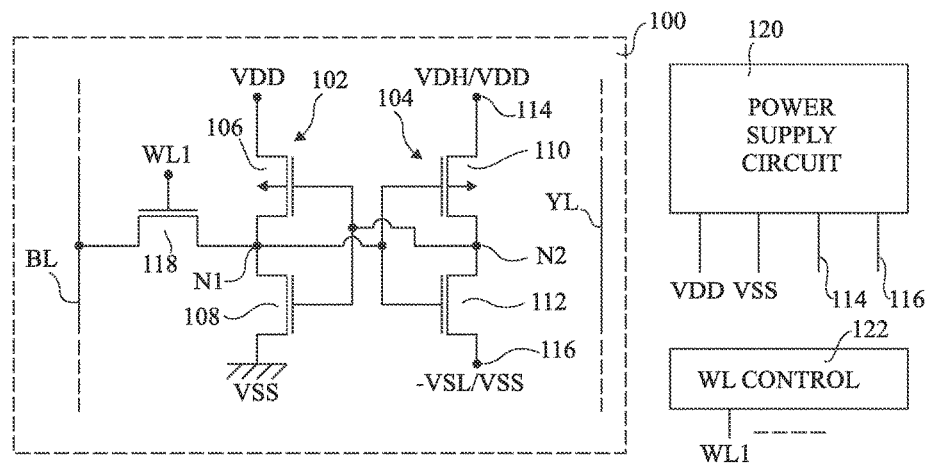
FIG. 1A schematically illustrates a 5T memory cell according to an example embodiment of the present disclosure.

FIG. 1A schematically illustrates a 5T memory cell 100 according to an example embodiment. While not illustrated in FIG. 1A, an SRAM for example comprises a plurality of the cells 100 arranged in an array of columns and rows.

The cell 100 for example comprises a pair of cross-coupled inverters 102, 104. In particular, the inverter 104 of the pair has its input coupled to a storage node N1 of the cell and its output coupled to a storage node N2 of the cell, and the inverter 102 of the pair has its input coupled to the storage node N2 and its output coupled to the storage node N1. In other words, the inverters are connected back to back.

The inverter 102 for example comprises a p-channel MOS (PMOS) transistor 106 and an n-channel MOS (NMOS) transistor 108 coupled in series by their main conducting nodes between supply voltages VDD and VSS, provided on corresponding supply voltage rails. An intermediate node between the transistors 106, 108 forms the storage node N1. The control nodes of the transistors 106, 108 are for example coupled to the storage node N2.

The inverter 104 for example comprises a p-channel MOS (PMOS) transistor 110 and an n-channel MOS (NMOS) transistor 112 coupled in series by their main conducting nodes between supply voltage rails 114 and 116. In one embodiment, the supply voltage rail 114 is at a supply voltage VDH, where VDH>VDD, and the supply voltage rail 116 is at a supply voltage−VSL, where VSL<VSS. In alternative embodiments, the memory cell 100 receives a supply voltage on the rail 114 that can vary between the level VDD and the level VDH, and a supply voltage on the rail 116 that can vary between the level VSS and the level −VSL.

The memory cell 100 further comprises a single transfer transistor 118 coupled by its main conducting nodes between the storage node N1 and a bit line BL. The transistor 118 is for example an NMOS transistor. The transistor 118 is for example controlled by a word line signal WL1, which is for example common for all the memory cells of the array of one row.

While not illustrated in FIG. 1A, the supply voltage rails 114, 116 for example run parallel to the bit line BL, and thus supply a plurality of the memory cells 100 forming a column.

As will be described in more detail below, in place of a complementary BL, a further line YL for example runs through the memory cell 100 and is for example used for the selection of memory cell blocks.

FIG. 1A further illustrates a power supply circuit (POWER SUPPLY CIRCUIT) 120, which for example generates supply voltages for a plurality of memory cells 100, for example the memory cells forming a column, or part of a column, of the array. In particular, the power supply circuit 120 for example generates the supply voltages VDD and VSS on corresponding rails, and the supply voltages to be applied to the rails 114, 116.

FIG. 1A further illustrates a word line control circuit (WL CONTROL) 122, which for example generates the word line signal WL1, and also further word line signals for other rows of the array. In some embodiments, the word line signals are generated by the circuit 122 to be at the level VSS when the corresponding row of memory cells is not selected, and at a level VDD when the corresponding row of memory cells is to be selected. In alternative embodiments, the voltage swing of the word line signal is greater than VDD. For example, the voltage for selecting the row of memory cells is a level VWL, where VWL>VDD. The level VWL is for example between 0.05 and 0.5 V higher than VDD, and in one example is equal to approximately 1 V. Additionally or alternatively, the voltage for not selecting the row of memory cells is a level −δ, where −δ<VSS.

In one embodiment, the voltage VDD is in the range 0.4 to 0.6 V, for example at 0.5 V, and the voltage VSS is at 0 V. The voltage VDH is for example at between 0.05 and 0.4 V above VDD, and the voltage −VSL is for example at between 0.05 and 0.4 V below VSS.

In one example, the threshold voltage Vt of the transistor 110 is higher than that of the transistor 106, and/or the threshold voltage Vt of the transistor 112 is higher than that of the transistor 108. Such changes to the threshold voltage are for example achieved by biasing differently the back-planes of the transistors.

Figure 1B:
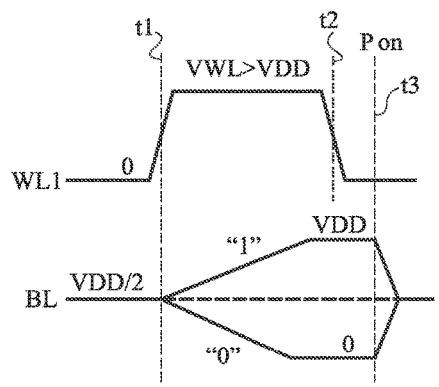
FIG. 1B is a timing diagram illustrating an example of voltage signals in the cell of FIG. 1A according to an embodiment of the present disclosure.

FIG. 1B is a timing diagram illustrating an example of the signal WL1 and of the voltage on the bit line BL in the memory cell of FIG. 1A during a read operation in the case that the word line signal has a voltage swing of VWL and the supply rails 114, 116 are coupled to VDH and VSL respectively.

At a time t1, the signal WL1 for example transitions from VSS to VWL in order to select the memory cell.

The bit line BL is for example pre-charged by a pre-charge circuit (not illustrated in FIG. 1A) to half the supply voltage VDD/2. More generally, the bit line BL is for example charged a level within 10 percent of the halfway voltage between VSS and VDD. At the time t1, the voltage on the bit line BL thus rises from VDD/2 to VDD or falls from VDD/2 to VSS depending on whether the memory cells stores a "1" value or a "0" value. A "1" value for example corresponds to the case in which the storage node N1 is at or close to VDD and the storage node N2 is at or close to −VSL, and a "0" value for example corresponds to the case in which the storage node N2 is at or close to VDH and the storage node N1 is at or close to VSS.

At a time t2, the signal WL1 for example transitions back to VSS.

At a time t3, a signal P, which for example controls the pre-charge circuit, is asserted, and the voltage on the bit line returns to the level VDD/2.

Figure 1C:
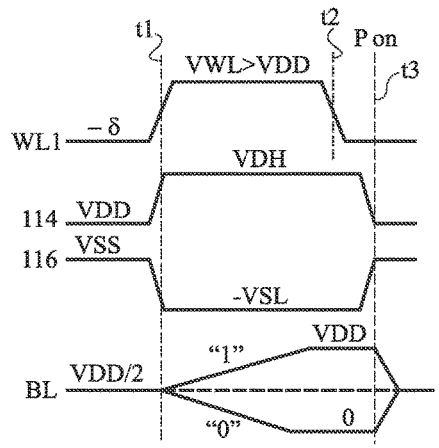
FIG. 1C is a timing diagram illustrating an example of voltage signals in the cell of FIG. 1A according to a further embodiment of the present disclosure.

FIG. 1C is a timing diagram illustrating examples of the signal WL1, of the voltages on the supply rails 114, 116 and of the voltage on the bit line BL in the memory cell of FIG. 1A during a read operation in the case that the word line signal has a voltage swing of VWL+δ, the voltage applied to the supply rail 114 is variable between VDD and VDH, and the voltage applied to the supply rail 116 is variable between VSS and VSL.

At the time t1, the signal WL1 for example transitions from −δ to VWL in order to select the memory cell. Furthermore, at the time t1, the voltage on the supply rail 114 rises from VDD to VDH, and the voltage on the supply rail 116 falls from VSS to −VSL. The bit line BL is again pre-charged to VDD/2, and thus, as in the example of FIG. 1B, the bit line voltage either rises to VDD or falls to VSS depending on the value that is read from the memory cell.

At a time t2 in FIG. 1C, the signal WL1 for example transitions back to VSS.

At a time t3 in FIG. 1C, the signal P is asserted to activate the pre-charge circuit, and thus the voltage on the bit line BL returns to VDD/2.

An advantage of applying one or both of the boosted supply voltages VDH and VSL to the supply rails 114, 116 is that the read and write speeds of the cell can be significantly increased. Indeed, the output voltage swing of the inverter 104 becomes larger than that of the inverter 102. Thus the transistor 106 or 108 of the inverter 102 will be forward biased in order to drive the capacitance $C_B$ of the bit line with increased GOD (gate-over-drive), and the other of the transistors 106 or 108 of the inverter 102 will be reverse biased leading to low current leakage.

For example, when a "0" value is read, the node N1 is at 0 V, and the gate of transistor 108 is boosted to the voltage VDH. Furthermore, in some embodiments, the voltage WL1 is also boosted to VWL. Thus the impedance of the read path composed of transistors 118, 108 is reduced, making the discharging of the bit line faster.

In a similar manner, when a "1" value is read, the node N1 is at VDD, and the gate of transistor 106 is boosted to the voltage −VSL. Furthermore, in some embodiments, the voltage WL1 is also boosted to VWL. Thus the impedance of the read path composed of transistors 118, 106 is reduced, making the charging of the bit line faster.

During a write operation, the voltage VDD or VSS is applied to the bit line BL depending on the data to be stored. The write speed is improved by the boosted level of the supply voltage on the rail 114 and/or 116 due to fast feedback within the memory cell. Indeed, when a "1" value is written, the storage node N1 is flipped from 0 V to VDD, and the speed is improved as the GOD of transistor 112 is increased as defined by $Vr-Vt_{eff}(112)=Vr-Vt(112)+VSL$, where Vr is the voltage ratio between transistors 118 and 108, and $Vt_{eff}(112)$ is the effective Vt of transistor 112.

Thus according to the embodiments described herein, a 5 transistor (5T) memory cell is for example assisted by WL-boosting and mid-point sensing (MID-S). If the WL voltage is not boosted, the speed of the cell is governed by the access transistor 118, which in some embodiments may prevent any overall gain in the speed of the flip-flop in the cell. To prevent read instability caused by the WL-boosting, the BL-precharge voltage, $V_P(BL)$, is for example reduced to VDD/2, and hence MID-S is for example performed. The voltage level VDD/2 works as the reference voltage for "1" and "0" signal discrimination. In addition, using the voltage level of VDD/2 halves the array dynamic power with halved BL-voltage swing. The 5T cell can be smaller than the 6T cell because one transistor and one BL are eliminated from the 6T cell thin-cell layout. The 5T cell uses one less bit line when compared to the 6T cell, and thus a contactless column line YL may be added within the same interconnection layer as the BLs and power supply lines in the 6T cell. The contactless column line YL, described in more detail below, also for example leads to a speed increase.

Figure 2A:
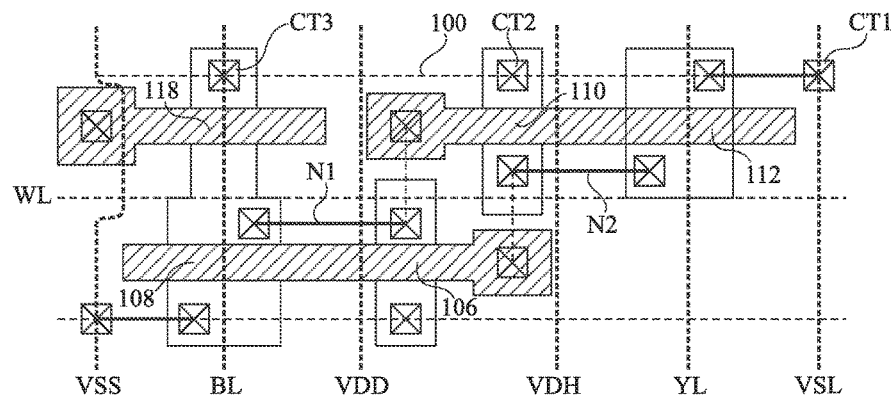
FIG. 2A illustrates a layout of the 5T memory cell of FIG. 1A according to an example embodiment of the present disclosure.

FIG. 2A illustrates a layout of the 5T memory cell 100 of FIG. 1A according to an example embodiment. The dotted lines running vertically in FIG. 2A represent the voltage supply rails VSS, VDD, VDH and VSL, the bit line BL and the selection line YL. Each of these lines/rails is for example formed in a second metal level M2 of the structure. A dotted line running horizontally in FIG. 2A represents the word line WL, which is for example formed in a metal level M1 of the structure. Grey zones represent diffused regions forming the sources/drains of the transistors, and diagonally shaded regions represent gate electrodes. Squares having a diagonal cross represent contacts between a metal level and an underlying diffused region. It will be noted that a contact CT1 between the VSL rail and the source of transistor 112, a contact CT2 between the VDH rail and the source of transistor 110, and a contact CT3 between the bit line BL and a source/drain of transistor 118 are positioned along one edge of the cell permitting these contacts to be shared by neighbouring cells, as will now be described with reference to FIG. 2B.

Figure 2B:
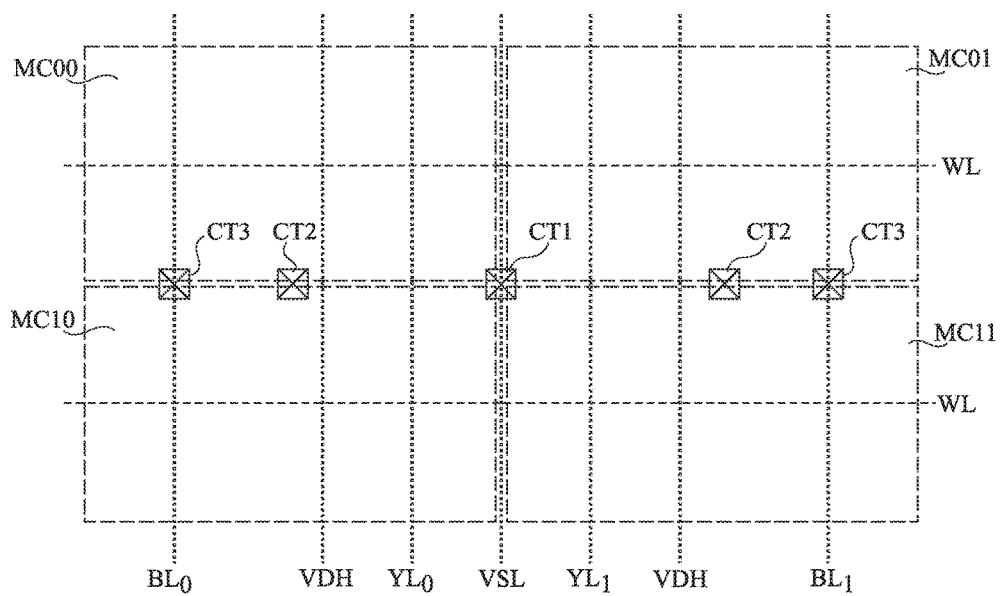
FIG. 2B illustrates an arrangement of four 5T memory cells of FIG. 1A according to an example embodiment of the present disclosure.

FIG. 2B illustrates an arrangement of four 5T memory cells MC00, MC01, MC10 and MC11 arranged in a two-by-two blocks, each cell being shown delimited by a dashed rectangle and having the layout of FIG. 2A. As illustrated, the contacts CT2 and CT3 are for example shared between the vertically adjacent cells MC00 and MC10, and the vertically adjacent cells MC01 and MC11. The layouts of these cells are for example a mirror image of each other in the vertical direction of FIG. 2B. Furthermore, all four cells for example share a same common contact CT1.

An advantage of the layout of FIG. 2B is that it provides a compact cell arrangement. Furthermore, it is possible to activate only certain columns of the memory cells by activating the supply voltages of only selected columns, as will be described in more detail below.

Examples of arrangements of the memory cell 100 in an SRAM will now be described with reference to FIGS. 3 to 5.

Figure 3A:
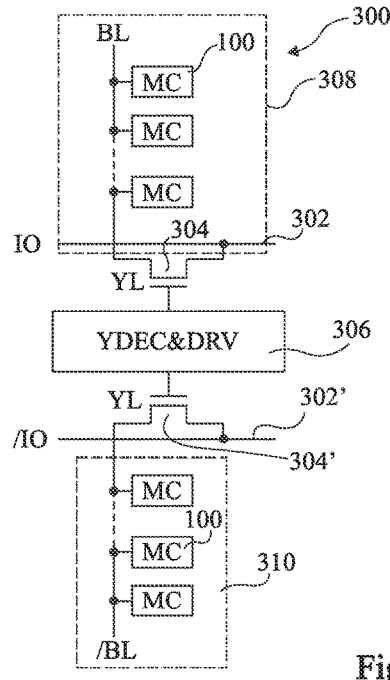
FIG. 3A schematically illustrates a memory cell block of a column of an SRAM according to an example embodiment.

FIG. 3A illustrates an example of an arrangement of memory cells (MC) forming a memory cell block 300. Each memory cell for example corresponds to the cell 100 of FIG. 1A. A bit line BL is coupled to a plurality of memory cells, and to an input/output line (IO) 302 via a switch 304 for example formed by an NMOS transistor. Similarly, a further bit line /BL is coupled to a further plurality of the memory cells 100, and to a further input/output line (/IO) 302' via a further switch 304' for example formed by an NMOS transistor. The switches 304, 304' are for example controlled by a selection signal YL provided by a column decoder and driver circuit (YDEC&DRV) 306. The memory cells coupled to bit line BL for example form a first memory cell sub-block 308, and the memory cells coupled to bit line /BL for example form a second memory cell sub-block 310. An advantage of dividing the column in this way is that the length of the bit lines can be reduced, thereby reducing the bit line capacitance $C_B$.

The number of memory cells 100 forming each of the memory cell sub-blocks 308, 310 is for example 32, although many of other numbers would be possible.

In the embodiment of FIG. 3A, the memory cell block selection line YL does not run through each cell, but is simply coupled to the control nodes of the switches 304, 304', which are for example positioned relatively close to the decoder and driver circuit 306.

Figure 3B:
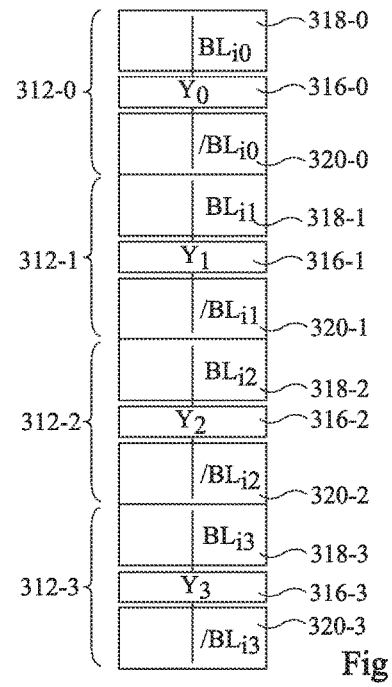
FIG. 3B schematically illustrates an SRAM comprising a plurality of SRAM sub-arrays based on the memory cell block of FIG. 3A according to an example embodiment.

FIG. 3B illustrates an example of an SRAM based on the memory cell blocks of FIG. 3A. In the example of FIG. 3B, there are four memory sub-arrays 312-0 to 312-3, arranged in a column, although in different embodiments a different number N of sub-arrays could be provided. Each of the sub-arrays 312-n comprises a block 318-n formed of a plurality of the memory cell sub-blocks 308 arranged in a row, the cells of a column i having a corresponding bit line BLi0 coupled to a decoder and drive block 316-n of the sub-array. The decoder and drive block 316-n for example comprises the decoder and drive block 306 of each column i. Furthermore, each of the sub-arrays 312-n comprises a block 320n formed of a plurality of the memory cell sub-blocks 310 arranged in a row, the cells of a column i having a corresponding bit line /BLi0 coupled to the decoder and drive block 316-n of the sub-array.

The number of memory cell sub-blocks 308 forming each block 318-n, and the number of memory cell sub-blocks 310 forming each block 320-n, is for example 16, although many other numbers would be possible.

Figure 4A:
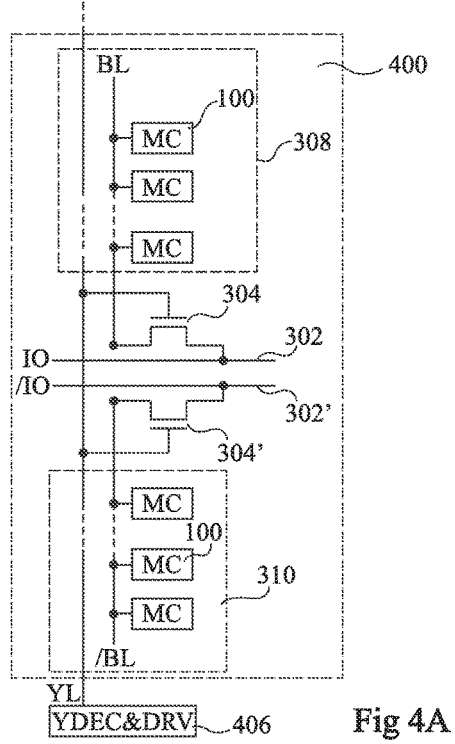
FIG. 4A schematically illustrates a memory cell block of a column of an SRAM according to a further example embodiment.

FIG. 4A illustrates an example of an arrangement of memory cells forming the memory cell block 400 according to a further example embodiment. Those elements in FIG. 4A which are the same as elements in FIG. 3A have been labelled with like reference numerals and will not be described again in detail.

The difference in the arrangement of FIG. 4A with respect to the one of FIG. 3A is that the decoder and drive block 306 is replaced by a decoder and drive block (YDEC&DRV) 406 at the bottom of the memory cell block 400, and is coupled to the switches 304, 304' via the memory cell selection line YL. The line YL for example runs parallel with the bit lines BL, /BL. In some embodiments, this line is positioned in the place of the complementary bit line in a 6T memory cell layout.

Figure 4B:
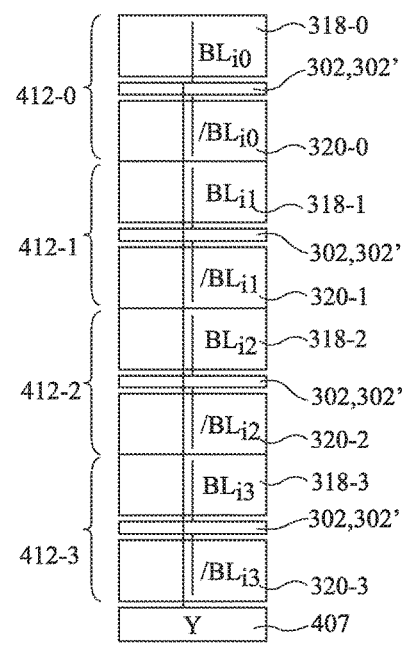
FIG. 4B schematically illustrates an SRAM comprising a plurality of SRAM sub-arrays based on the memory cell block of FIG. 4A according to further example embodiment.

FIG. 4B illustrates an example of an SRAM based on the memory cell blocks of FIG. 4A, and is similar to FIG. 3B, except that the decoder and drive blocks 316-n are replaced by the decoder and drive block 407 placed at the bottom of the column, the blocks 407 comprising the decoder and drive block 406 of each column. There is for example one memory cell block selection line $YL_i$ for each column i, although in some embodiments a plurality of columns share a selection line. The selection line $YL_i$ is for example common for each sub-array 412-n.

FIG. 5A illustrates an example of an arrangement of memory cells forming the memory cell block 500 according to yet a further example embodiment. This embodiment is similar to the one of FIG. 3A, except that the decoder and drive block 306 is replaced by a decoder and drive block 506, which generates two selection signals $YL_0$ and $YL_1$. In some embodiments, it is possible for the signals $YL_0$ and $YL_1$ to be the same signal. The memory cells 100 are arranged in a column divided into a group 508 of memory cells coupled to the bit line $/BL_0$ and not to a bit line $BL_0$, and a further group 510 of memory cells coupled to the line $BL_0$ and not to the line $/BL_0$. The signal $YL_0$ selects the first and second groups 508, 510 of memory cells. In particular, the bit line $BL_0$ is coupled to an input/output line 302-0 via a switch 304-0 controlled by the signal $YL_0$, and the bit line $/BL_0$ is coupled to an input/output line 302'-0 via a switch 304'-0 also controlled by the signal $YL_0$. The bit lines $BL_0$ and $/BL_0$ are for example positioned in the same way as for a folded BL arrangement. A difference is however that these bit lines cross-over between the groups 508, 510, such that all of the memory cells contact the bit line $BL_0$ or $/BL_0$ on the same side. In alternative embodiments, the bit lines $BL_0$ and $/BL_0$ could be straight, without any cross-over, and the cells of the group 508 could contact the bit line $/BL_0$ on one side, and the cells of group 510 could contact the bit line $BL_0$ on the opposite side. An advantage of providing the cross-over between the bit lines $BL_0$ and $BL_0/$ is that this leads to a well-balanced pair of bit lines, the loads on the bit lines being substantially the same.

The memory cell block 500 also for example comprises further groups 508', 510' of memory cells, which are similar to the groups 508, 510, and not illustrated in detail. The memory cells of groups 508', 510' are for example respectively coupled to bit lines $/BL_1$ and $BL_1$, which are in turn coupled to input/output lines 302-1, 302'-1 via switches 304-1, 304'-1 controlled by the selection signal $YL_1$.

FIG. 5B illustrates an example of an SRAM based on the memory cell block 500 of FIG. 5A, and is similar to FIG. 3B. There are for example four memory sub-arrays 512-0 to 512-3, each comprising a plurality of the memory cell blocks 500 arranged in a row. In particular, each sub-array comprises a sub-block 518-n comprising the sub-blocks 508, 510 of each column i, and a further sub-block 520-n comprising the sub-blocks 508', 510' of each column i, and a decoder and drive block 516-n comprising the decoder and drive block 506 of each column i. Each of the blocks 516-0 to 516-3 thus for example comprises two pairs of input/output lines 302, 302'.

FIG. 6A schematically illustrates an SRAM in more detail according to an example implementation based on the memory cell arrangement of FIGS. 4A and 4B, and for the case that the supply voltages provided on the supply rails 114, 116 of each memory cell are fixed at VDH and VSL respectively. The memory sub-arrays 412-0 to 412-3 are also labelled $PMA_0$ to $PMA_3$ and FIG. 6A, and this arrangement has the advantage that only one of the PMAs can be activated at once to allow the circuit to have low power consumption. In particular, rather than providing continuous bit lines through the array, the length of each bit line is divided into four sections corresponding to the four sub-arrays $PMA_0$ to $PMA_3$. When an operation is to be performed on a memory cell of one of the memory sub-arrays, the corresponding word line is asserted, causing that sub-array to be activated without activating the other sub-arrays.

On the left in FIG. 6A, one of the memory cell blocks 400 of the memory cell blocks 400 of the memory sub-array 412-0 is illustrated for a case in which it comprises a column of 64 memory cells. FIG. 6A illustrates the corresponding word lines $WL_0$ to $WL_{63}$ coupled to the corresponding memory cells. Of course, in alternative embodiments there could be a different number of memory cells in each memory cell block 400. In addition to input/output lines 302, 302', and the switches 304, 304', each memory cell block 400 also for example comprises a pre-charge circuit 604, which is for example a half-VDD pre-charger (HVP) having inputs coupled to the bit line $BL_{00}$ of the memory cell block 400. In some embodiments, each memory cell block 400 further comprises a sense amplifier 606 having inputs coupled to the bit line $BL_{00}$ of the memory cell block 400. The sense amplifier 606 is for example coupled to supply rails SPL and SNL. In some embodiments however, the sense amplifier 606 could be omitted.

The input/output lines 302, 302' of each memory sub-array 412-$n$ are for example coupled to corresponding sub-array selection switches 608-$n$, and each of the switches 608-$n$ selectively couples the input/output lines 302, 302' to global input/output lines 610, 610' of the SRAM. These lines 610, 610' are for example coupled to a read write circuit (RWC) 611.

There is for example a selection line $YL_i$ for each column i of the memory sub-arrays 412-$n$, and the switches 608-$n$ permit the output of one of the sub-arrays 412-$n$ to be coupled to the read write circuit (RWC) 611.

FIG. 6B is a timing diagram illustrating an example of the signals $WL_0$, $BL_{00}$ and $/BL_{00}$, the voltages SPL, SNL, the selection signal $YL_0$, and the voltage on the input/output lines LIOs 302, 302' and on the global input/output lines GIOs 610, 610' during a read operation of a "1" value from a memory cell coupled to bit line $BL_{00}$ and to word line $WL_0$.

During the read operation, the bit line of the memory cell to be read is pre-charged to the pre-charge voltage $V_{PRE}$, and the input/output lines 302, 302', and global input/output lines 610, 610' are for example pre-charged to VDD. The pre-charge voltage $V_{PRE}$ is for example equal to substantially VDD/2. The voltage VWL on the word lines WL of the memory cell to be read is then asserted.

The signal $WL_0$ for example starts at VSS, and then transitions to a level VWL. The voltage level VWL is for example equal to 2VDD. Assuming that the data being read is a "1" value, the signal $BL_{00}$ for example starts to rise, and when it reaches a threshold level S1, the signals SPL and SNL are activated to power the sense amplifier 606. The threshold S1 for example corresponds to a sense amplifier offset of 100 mV. The signals SPL and SNL are for example initially both at VDD/2, and when the threshold level S1 is reached, the signal SPL rises to VDD, and the signal SNL falls to VSS. This results in acceleration in the rise of the signal on the bit line $BL_{00}$, and also results in the voltage on the bit line $/BL_{00}$ falling to VSS. Then, when a further threshold S2 is reached by the voltage on the bit line $BL_{00}$, the selection signal $YL_0$ is for example asserted, for example at a level of 2VDD, in order to couple the bit line $BL_{00}$ to the input/output line 302, and the bit line $/BL_{00}$ to the input/output line 302'. The threshold S2 for example corresponds to a voltage of around 400 mV. The bit lines $BL_{00}$ and $/BL_{00}$ are thus coupled to the input/output lines 302, 302', and to the global input/output lines 610, 610' by activating the corresponding selected row switch 608-0. The signal on the lines 610, 610' is then for example amplified by a sense amplifier in the read write circuit 611. The signal $WL_0$ then goes low, the pre-charge circuit 604 is again activated to bring the bit line voltages and SPL/SNL voltages back to VDD/2, and the line $YL_0$ is brought back to VSS. The pre-charging and equalizing of the bit lines is for example performed without drawing external current, permitting on-chip generation of the pre-charge voltage $V_{PRE}$ in a simple fashion.

During a write operation, the read write circuit 611 is for example adapted to apply, via selected switches 608-$n$ and 304, 304', a voltage of VDD to the bit line $BL_{00}$ or to the bit line $/BL_{00}$ depending on the data to be written, and a voltage of VSS to the other bit line. The memory cell to be written is then coupled to the bit line $BL_{00}$ or $/BL_{00}$ by activating the corresponding word line.

Figure 6C:
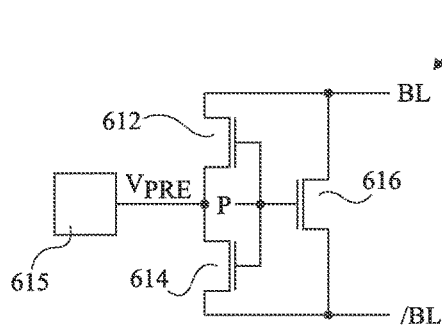
FIG. 6C schematically illustrates a pre-charge circuit of the SRAM of FIG. 6A according to an example embodiment.

FIG. 6C schematically illustrates the pre-charge circuit 604 of FIG. 6A in more detail according to an example embodiment. The circuit for example comprises NMOS transistors 612, 614 coupled in series via their main conducting nodes between the bit lines BL and /BL. An intermediate node between these transistors receives the pre-charge voltage $V_{PRE}$ from a generation circuit 615. The control nodes of the transistors 612, 614 are for example coupled together and receive the pre-charge pulse P that activates the pre-charge circuit 604. The bit lines are also for example coupled together via a further NMOS transistor 616 also controlled at its gate node by the signal P.

Figure 6D:
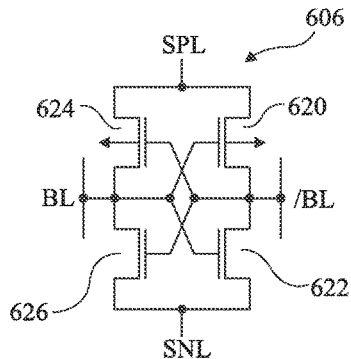
FIG. 6D schematically illustrates a sense amplifier of the SRAM of FIG. 6A according to an example embodiment.

FIG. 6D schematically illustrates the sense amplifier 606 of FIG. 6A in more detail according to an example embodiment. This circuit for example comprises a PMOS transistor 620 and an NMOS transistor 622 coupled in series via their main conducting nodes between the line SPL and the line SNL. An intermediate node between the transistors 620, 622 is coupled to the bit line /BL. The circuit 606 also for example comprises a PMOS transistor 624 and an NMOS transistor 626 coupled in series via their main conducting nodes between the line SPL and the line SNL. An intermediate node between the transistors 624, 626 is coupled to the bit line BL, and to the control nodes of transistors 620, 622. The intermediate node between transistors 620, 622 is also for example coupled to the control nodes of transistors 624, 626. The transistors 620 to 624 for a bi-stable circuit which amplifies any voltage difference between the bit lines.

Figure 6E:
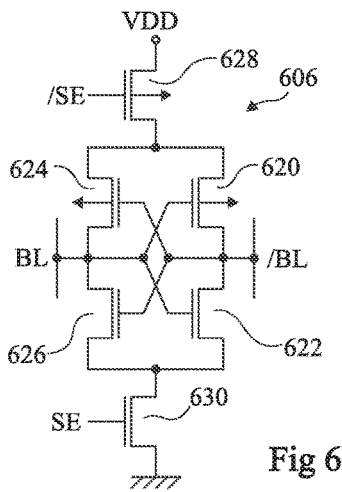
FIG. 6E schematically illustrates a sense amplifier of the SRAM of FIG. 6A according to a further example embodiment.

FIG. 6E illustrates the sense amplifier 606 according to an alternative embodiment similar to that of FIG. 6D, but in which, rather than being connected between the lines SPL and SNL, the transistors 620 and 624 are coupled to the supply rail VDD via an isolation transistor 628 receiving at its control node a signal /SE, and the transistors 622, 626 are coupled to the supply rail VSS via an isolation transistor 630 receiving at its control node a signal SE. The isolation transistors 628, 630 prevent voltage coupling with the other bit lines via the common nodes SPL, SNL of FIG. 6D.

Figure 6F:
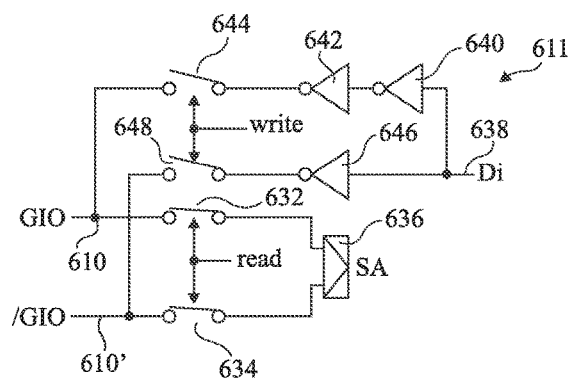
FIG. 6F schematically illustrates a read write circuit of the SRAM of FIG. 6A according to an example embodiment.

FIG. 6F illustrates the read write circuit 611 in more detail according to an example embodiment. The global input/output lines 610, 610' are coupled via switches 632, 634 respectively to the inputs of a sense amplifier 636, which could for example be implemented by the circuit of FIG. 6D or 6E. The switches 632, 634 are for example controlled by a signal read, such that they are conducting during a read operation. A data input signal $D_i$ is received on an input line 638. The line 638 is for example coupled via inverters 640, 642 and a switch 644 to the line 610, and via an inverter 646 and a switch 648 to the line 610'. The switches 644 and 648 are for example controlled by a signal write such that they are conducting during a write operation. In some embodiments, the sense amplifier 606 of each memory cell block 300 could be omitted, and only the sense amplifier 636 of the read write circuit 611 could be provided.

Figure 6G:
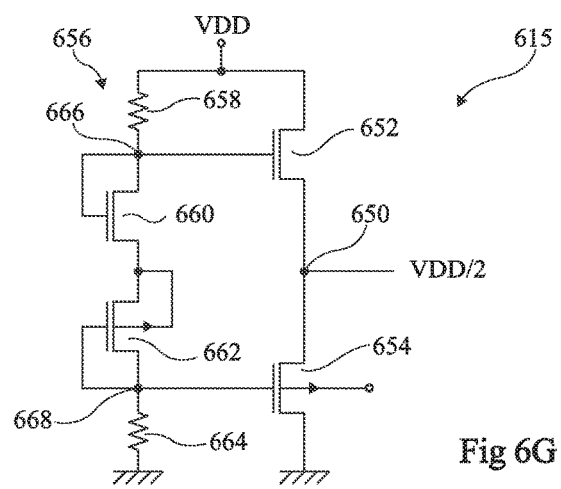
FIG. 6G schematically illustrates a pre-charge voltage generation circuit of the pre-charge circuit of FIG. 6C according to an example embodiment of the present disclosure.

FIG. 6G illustrates the pre-charge voltage generation circuit 615 of FIG. 6C in more detail according to an example embodiment, in the case that the pre-charge voltage $V_{PRE}$ is at VDD/2. The level of VDD/2 is for example generated at a node 650 by a potential divider formed by an NMOS transistor 652 and a PMOS transistor 654 coupled in series by their main conducting nodes between the VDD supply rail and ground. The circuit 615 for example further comprises a reference branch 656 for generating control voltages for the transistors 652, 654. The reference branch for example comprises a resistor 658, an NMOS transistor 660, a PMOS transistor 662 and a resistor 664 coupled in series with each other between VDD and ground. The control node of the NMOS transistor 660 is for example coupled to an intermediate node 666 between the resistor 658 and the transistor 660, and to the control node of the NMOS 652. Similarly, the control node of the PMOS transistor 662 is for example coupled to an intermediate node 668 between the resistor 664 and the transistor 662, and to the control node of the NMOS 654.

Figure 7A:
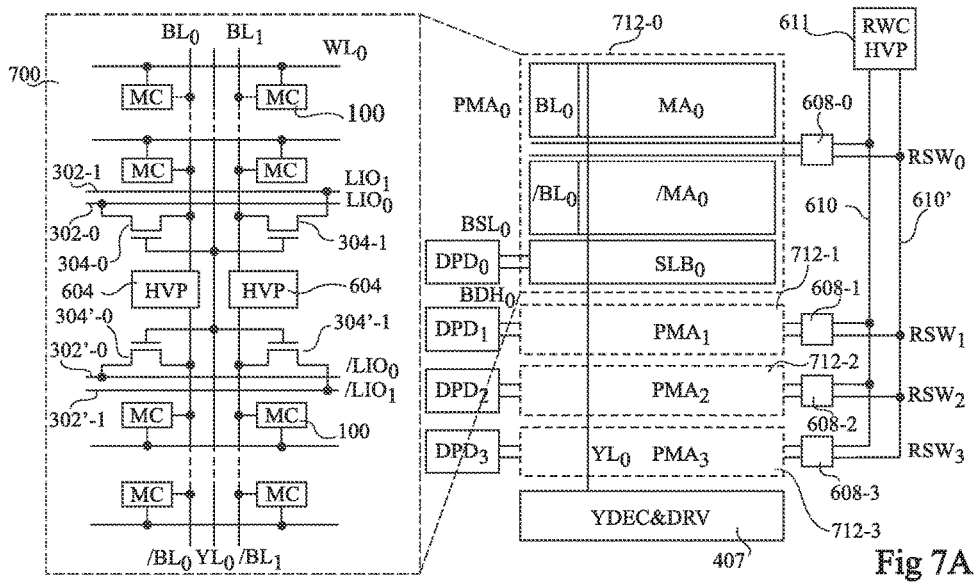
FIG. 7A schematically illustrates an SRAM in more detail according to a further example embodiment.

FIG. 7A schematically illustrates an SRAM in more detail according to an example similar to the SRAM of FIG. 6A, and like features have been labelled with like reference numerals and will not be described again in detail. However, the SRAM of FIG. 7A is an implementation based on a modified version of the memory cell arrangement of FIGS. 4A and 4B, and for the case that the supply voltages provided on the supply rails 114, 116 of each memory cell are capable of being changed dynamically, depending on the operating mode. In particular, as described above with reference to FIGS. 1 and 2B, during a standby mode the line 114 is controlled to be at the voltage VDD and the line 116 is controlled to be at the voltage VSS, leading to low current leakage. During an active mode, the line 114 is controlled to be at VDH, and the line 116 is controlled to be at −VSL, enabling high speed. In some embodiments, to enable a particularly fast write operation, the threshold voltages Vt of the transistors 110, 112 are for example also reduced with respect to those of the transistors 106 and 108 respectively. The leakage current of activated cells will thus be relatively high. Advantageously, the number of activated cells in the array is reduced by providing the partitioned array, with sub-arrays that may be powered independently from each other, as will be described in more detail below.

In the embodiment of FIG. 7A, the memory cell block 400 of FIG. 6A is replaced by a memory cell block 700 in which a single memory cell block selection line $YL_j$ is provided for two pairs of adjacent bit lines. For example, a single selection line $YL_0$ is provided for the bit lines $BL_0$, $/BL_0$, $BL_1$, $/BL_1$. Thus switches 304-0, 304'-0 and 304-1 and 304'-1 of adjacent columns all for example have their control nodes coupled to the line $YL_0$, and there are two pairs of input/output lines 302-0, 302'-0 and 302-1, 302'-1 per memory cell block 700. There are also two corresponding pairs of global input/output lines 610-0, 610'-0 and 610-1, 610'-1. This means that each operation for example involves accessing two adjacent transistors at the same time.

Again, there are for example four SRAM sub-arrays 712-0 to 712-3, although in alternative embodiments there could be another number of sub-arrays. Each memory sub-array 712-n for example comprises 16 memory cell blocks 700.

In the embodiment of FIG. 7A, each of the memory sub-arrays 712-n for example comprises a dynamic power driver $DPD_n$ and a selector circuit $SLB_n$. These circuits for example for part of the power supply circuit 116 of FIG. 1A, and permit the power supply rails 114, 116 of the memory cells in each of the memory sub-arrays 712-n to be controlled independently of the other memory sub-arrays.

Figure 7B:
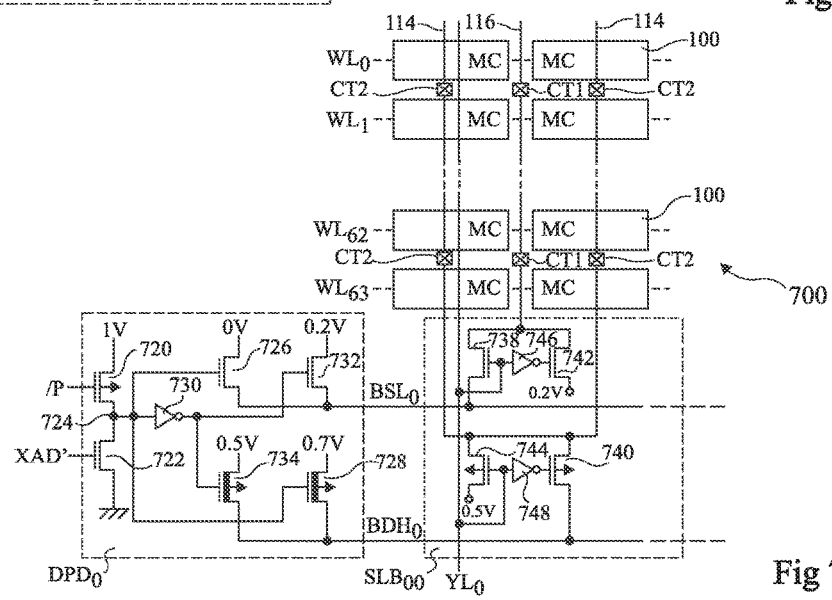
FIG. 7B schematically illustrates parts of the SRAM of FIG. 7A in more detail according to an example embodiment.

FIG. 7B illustrates the dynamic power driver $DPD_0$ and a sub-block $SLB_{00}$ of the selector circuit $SLB_0$ in more detail according to an example embodiment in which VDD is at 0.5 V, VSS is at 0 V, VDH is at 0.7 V, and VSL is at −0.2 V. Of course, other levels of these signals would be possible.

In some embodiments, all of the memory cells of the array could be coupled to the boosted supply voltages VDH, VSL when any read and/or write is to be performed in the SRAM, which we will call active mode, and to the standard voltages VDD, VSS at other times, which we will call standby mode.

However, according to the example of FIG. 7B, only a subset of the memory cells of the array are coupled to the boosted supply voltage VDH, VSL at any one time. For example, the power driver $DPD_n$ and the selector circuit $SLB_n$ of each sub-array permits that sub-array to be powered independently of the others. Thus, when any sub-array is active, the supply voltages VDH, VSL are for example applied to the supply rails 114, 116 of its memory cells, and when any sub-array is not active, the supply voltages VDD, VSS are for example applied to the supply rails 114, 116 of its memory cells. Of course, in alternative embodiments, rather than dividing the SRAM into the sub-arrays for the purpose of power distribution, other divisions of the SRAM would be possible. For example, each of the 16 pairs of columns of memory cells could be coupled to a corresponding selector circuit.

In the example of FIG. 7B, the circuit $DPD_0$ for example comprises a PMOS transistor 720 and an NMOS transistor 722 coupled in series by their main conducting nodes between a supply voltage, for example at 1 V, and ground. An intermediate node 724 between the transistors 720, 722 is for example coupled to the control node of an NMOS transistor 726 and to the control node of a low Vt PMOS transistor 728. The node 724 is also coupled via an inverter 730 to the control node of an NMOS transistor 732 and to the control node of a low Vt PMOS transistor 734. The low Vt transistors 728, 734 for example have threshold voltages of between 0.05 and 0.2 V lower than the Vt of the other transistors in the circuit, and for example of between 0.2 and 0.35 V.

The transistor 726 is for example coupled by its main conducting nodes between the VSS supply voltage and a line $BSL_0$, and the transistor 732 is for example coupled by its main conducting nodes between the VSL supply voltage and the line $BSL_0$. The transistor 734 is for example coupled by its main conducting nodes between the VDD supply voltage and a line $BDH_1$, and the transistor 728 is for example coupled by its main conducting nodes between the VDH supply voltage and the line $BDH_1$. The transistor 720 is controlled at its control node by the inverse /P of the pre-charge pulse signal P, and the transistor 722 is controlled by an address signal XAD'. The address signal XAD' indicates whether the sub-array 712-n is selected for a read or write operation. For example, when XAD' is high or when the pre-charge pulse signal P is asserted, the sub-array 712-0 is in the standby/pre-charge mode, and the voltages VDD and VSS are applied to the lines $BDH_0$ and $BSL_0$ respectively. When the signal XAD' is low, and the pre-charge pulse is not asserted, the voltages VDH and VSL are applied to the lines $BDH_0$ and $BSL_0$ respectively.

FIG. 7B also illustrates the selector circuit sub-block $SLB_{00}$ associated with a memory cell block 700 coupled to the selection line $YL_0$. The selector circuit $SLB_0$ for example comprises a similar sub-block associated with each of the other memory cell blocks of the sub-array.

In the sub-block $SLB_{00}$, the line $BSL_0$ is for example coupled to the supply rail 116 of the memory cell block 700 via an NMOS transistor 738, and the line $BDH_0$ is coupled to the supply rail 114 of the memory cell block 700 via a PMOS transistor 740. The supply rail 116 is also for example coupled to a voltage level of −0.2 V via an NMOS transistor 742, and the supply rail 114 is also for example coupled to the a voltage level of 0.5 V via a PMOS transistor 744. The control node of transistor 738 is for example coupled to the selection line $YL_0$, and the control node of transistor 742 is for example coupled to the selection line $YL_0$ via an inverter 746. Similarly, the control node of transistor 744 is for example coupled to the selection line YL$_0$, and the control node of transistor 740 is for example coupled to the selection line YL$_0$ via an inverter 748.

Thus, the sub-block SLB$_{00}$ applies the boosted supply voltages to the supply rails 114, 116 if in the active mode, and if the corresponding selection signal YL$_0$ is asserted.

While not illustrated in FIG. 7B, the inverters 730, 746 and 748 are for example powered by a 1 V supply.

Figure 7C:
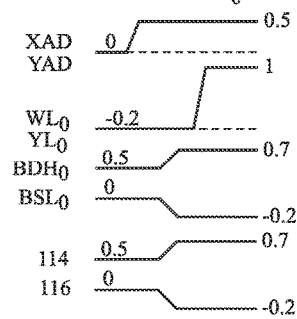
FIG. 7C is a timing diagram illustrating an example of signals in the SRAM of FIG. 7A according to an example embodiment.

FIG. 7C is a timing diagram illustrating an example of the signals XAD, YAD, WL$_0$, YL$_0$, BDH$_0$ and BSL$_0$, and the voltages on the power supply rails 114, 116 according to an example embodiment.

The signal XAD for example transitions high, indicating that the SRAM sub-array 712-0 is active, and thus the voltages on the lines BDH$_0$ and BSL$_0$ respectively change from 0.5 to 0.7 V and from 0 to −0.2 V. The voltages on the supply rails 114, 116 change accordingly. Furthermore, in this example, the signal WL$_0$ for example transitions from −0.2 V to 1 V in order to select the memory cell.

FIG. 8 schematically illustrates an SRAM according to an example implementation based on the memory cell block 500 of FIGS. 5A and 5B.

In the example of FIG. 8, rather than providing a decoder and drive block for each sub-array, there is a single block 805 for all of the arrays 512-0 to 512-3, and the arrays for example share common selection lines YL$_i$ like in FIG. 6B.

While in the embodiment of FIG. 8 the memory cells 100 are for example implemented by the 5T cell of FIG. 1A, and the bit lines are driven by a half-VDD pre-charger (HVP) 604, in alternative embodiments the memory cells 100 of FIG. 8 could be of a different type, such as a conventional 6T cell, and a full VDD pre-charger could be used.

FIG. 9 schematically illustrates an SRAM cell 900 according to a further example embodiment of the present disclosure. This circuit is for example the same as the cell 100 of FIG. 1A, but the inverter 104 is replaced by an inverter 902 comprising an additional NMOS transistor 904 coupled by its main conducting nodes between the transistor 112 and the supply voltage rail 116. The control node of transistor 902 is for example coupled to the storage node N1. The memory cell 900 could for example replace the memory cell 100 in any of the previously described embodiments.

While not illustrated in FIG. 9, additionally or alternatively, a PMOS transistor could be added between the transistor 110 and the supply rail 114, such a PMOS transistor for example having its control node coupled to the storage node N1.

FIG. 10A schematically illustrates part of an SRAM according to yet a further example embodiment of the present disclosure, based on an SRAM cell 1000. The cell 1000 could replace the cell 100 in any of the previously described embodiments. The memory cell 1000 may also be used as a dual port memory.

The cell 1000 is similar to the cell 100 of FIG. 1A, but additionally comprises an NMOS transistor 1002 having its control node coupled to the storage node N2, one of its main conducting nodes coupled to the VSS supply rail, and the other of its main conducting nodes coupled to a read bit line RBL via a further NMOS transistor 1004. The bit line BL is replaced in FIG. 10A by a write bit line WBL. The transistor 1004 is for example controlled by a read write signal RWL.

The write bit line WBL is for example coupled to the half VDD pre-charge circuit 604 associated with a column of the memory cells 1000. The read bit line RBL is for example coupled to a full VDD pre-charge (FVP) circuit 1006 associated with the column of the memory cells 1000.

A write operation in the cell 1000 for example involves coupling the write bit line WBL to VDD or VSS depending on the data to be written, and rending the transistor 118 conductive, for example using a boosted word line voltage level VWL.

A read operation in the cell 1000 will now be described in more detail with reference to FIG. 10B.

FIG. 10B is a timing diagram illustrating an example of the signal RWL and the voltage on the line RBL in the SRAM of FIG. 10A during a read operation according to an example embodiment. The line RBL is for example pre-charged to VDD by the circuit 1006, and the signal RWL is for example brought high to a level of VDD to render the transistor 1004 conductive. Rather than being brought to VDD, the signal RWL may be brought to a level of $V_H$>VDD+Vt(118), where Vt(118) is the threshold voltage of the transistor 118. The voltage on the line RBL will then either remain at VDD ("0" value read at N2) or fall to VSS ("1" value read at N2) depending on the voltage state at the node N2, which will cause the transistor 1002 to be conductive or non-conductive.

An advantage of the embodiments described herein is that, by boosting the supply voltage applied to the inverter 104 of the SRAM cell, improved read and write speeds may be obtained using a compact cell.

Figure 11:
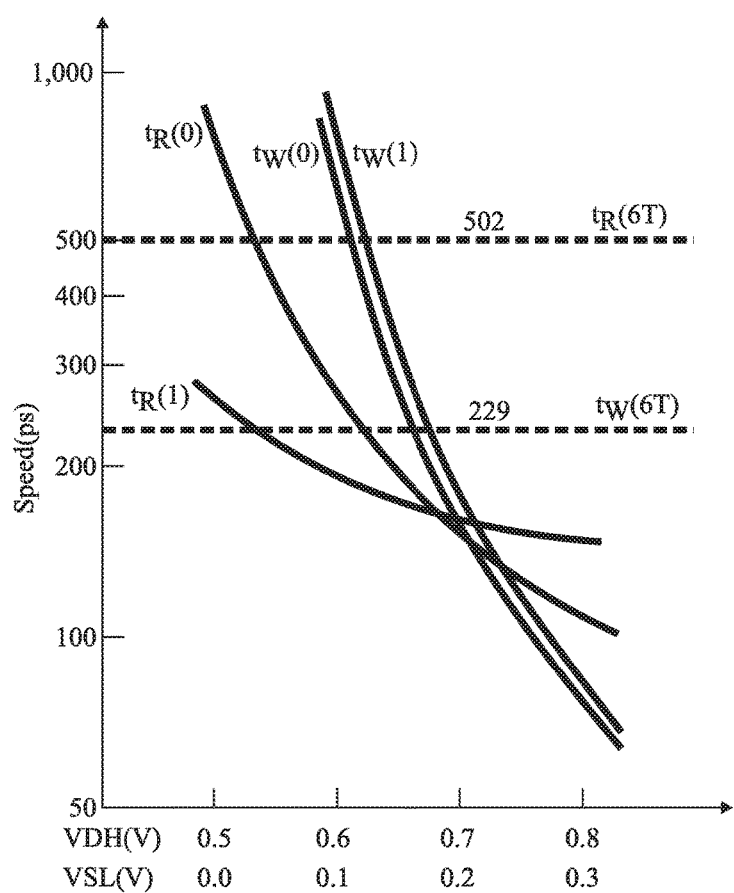
FIG. 11 is a graph illustrating an example of read and write speeds according to an example embodiment of the present disclosure.

FIG. 11 is a graph illustrating an example of read speeds $t_R$ for "0" and "1" values, and write speeds $t_W$ for "0" and "1" values, in the memory cell 100 of FIG. 1A according to an example embodiment of the present disclosure. As illustrated, the present inventors have found that increasing VDH and lowering VSL leads to a reduction in the time for read and write operations. The example of FIG. 11 is based on the 5 T cell of FIG. 1A in which the threshold voltage Vt of transistor 118 is at 343 mV, the threshold voltages of transistors 106, 110 are at 218 and 420 mV respectively, the threshold voltages of transistors 108 and 112 are at 491 and 544 mV respectively, the width of transistors 106, 110 are 120 and 80 nm respectively, the widths of the other transistors are at 80 nm, the word line voltage VWL is at 1 V, VDD, VDH and VSL are at 0.5, 0.7 and 0.2 V respectively, and the bit line pre-charge voltage $V_{PRE}$ is at 0.25 V. It can be seen that advantageously, for a voltage VDH of 0.7 V and a voltage VSL of 0.2 V, the operation time for each read and write operation is approximately equal, the time for writing a "0" value being 160 ps, the time for writing a "1" value being 174 ps, the time for reading a "0" value being 160 ps, and the time for reading a "1" value being 166.

An advantage of the memory cell arrangement of FIGS. 3A, 4A and 5A is that, by dividing the memory array in the bit line direction, the capacitance of the bit lines can be reduced, leading to reduced power consumption. Furthermore, the addition of the selection line YL permitting such an implementation can for example be performed without an increase in area with respect to a conventional 6T SRAM by using the space previously occupied by the complementary bit line.

A further advantage of the memory cell 900 of FIG. 9 is that the leakage current is further reduced by the addition of the transistor 902 thanks to stacking effects.

An advantage of the memory cell 1000 of FIG. 10 is that, by boosting the supply voltages of the inverter 104, the GOD of the transistor 1002 is increased, and thus the speed of the read operation is likewise increased.

Having thus described at least one illustrative embodiment, various alterations, modifications and improvements will readily occur to those skilled in the art.

For example, it will be apparent to those skilled in the art that embodiments have been described based on MOS transistors, alternative embodiments could at least partially be based on other transistor technologies such as bipolar technology.

Furthermore, it will be apparent to those skilled in the art how the VDD supply rail and ground/VSS rail in the various embodiments could be exchanged with each other, and that rather than a ground/VSS voltage, a different supply voltage level could be used, such as a negative voltage could be applied in some circuits.

Furthermore, it will be apparent to those skilled in the art that the various features described in relation to the various embodiments could be combined, in alternative embodiments, in any combination.

What is claimed is:

1. A static random access memory (SRAM) comprising:
a plurality of memory cells each having a pair of cross-coupled inverters, a first of the inverters being supplied by first and second power supply rails and a second of the inverters being supplied by third and fourth supply rails, an input of the second inverter being coupled to a first bit line via a first transistor; and
a power supply circuit adapted to apply, during a read phase of one of the memory cells, a first voltage difference across the first and second power supply rails and a second voltage difference across the third and fourth power supply rails of said memory cell, the second voltage difference being greater than the first voltage difference.

2. A static random access memory (SRAM) comprising:
a plurality of memory cells each having a pair of cross-coupled inverters, a first of the inverters being supplied by first and second power supply rails and a second of the inverters being supplied by third and fourth supply rails, an input of the second inverter being coupled to a first bit line via a first transistor; and
a power supply circuit adapted to apply a first voltage difference across the first and second power supply rails and a second voltage difference across the third and fourth power supply rails, the second voltage difference being greater than the first voltage difference, wherein the power supply circuit is adapted to apply first, second, third and fourth voltages to the first, second, third and fourth power supply rails respectively, wherein the third voltage is higher than the first voltage, and the fourth voltage is lower than the second voltage, the SRAM further comprising a bit line pre-charge circuit adapted to generate a pre-charge voltage for pre-charging the first bit line, the pre-charge voltage being within 10 percent of the intermediate level between the first and second voltages.

3. A static random access memory (SRAM) comprising:
a plurality of memory cells each having a pair of cross-coupled inverters (102, 104, 902), a first of the inverters (102) being supplied by first and second power supply rails (VDD, VSS) and a second of the inverters (104, 902) being supplied by third and fourth supply rails (114, 116), an input of the second inverter (102) being coupled to a first bit line (BL, WBL) via a first transistor (118); and
a power supply circuit (120) adapted to apply a first voltage difference (VDD) across the first and second power supply rails (VDD, VSS) and a second voltage difference (VDH, VSL) across the third and fourth power supply rails (114, 116), the second voltage difference being greater than the first voltage difference, wherein the power supply circuit (120) is adapted to apply first, second, third and fourth voltages to the first, second, third and fourth power supply rails respectively, wherein the third voltage (VDH) is higher than the first voltage (VDD), and the fourth voltage (VSL) is lower than the second voltage (VSS), the SRAM further comprising a word line activation circuit adapted to render conductive the first transistor of a plurality of the memory cells by applying a fifth voltage to a control node of the first transistor, the fifth voltage being higher than the first and second voltages.

4. The SRAM of claim 1, wherein the power supply circuit is adapted to apply the second voltage difference across the third and fourth power supply rails of a first of the memory cells during an active mode of the first memory cell, and to apply a voltage difference smaller than the second voltage difference across the third and fourth power supply rails during a standby mode of the first memory cell.

5. The SRAM of claim 4, wherein the power supply circuit comprises a plurality of power control circuits, a first of the power control circuits being coupled to the third and fourth power supply rails of the first memory cell, and a second of the power control circuits being coupled to the third and fourth power supply rails of a second of the memory cells, and wherein the power supply circuit is adapted to control the voltage difference applied across the third and fourth power supply rails based on one or more signals indicating when a portion of the SRAM comprising the first memory cell is selected to be the object of a read or write operation.

6. The SRAM of claim 1, comprising:
a memory cell block comprising a first plurality of the memory cells, each memory cell of the first plurality being coupled to the first bit line, wherein the first bit line is coupled to a first input/output line of the memory cell block via a first switch controlled by a selection signal provided on a selection line.

7. The SRAM of claim 6, wherein the first plurality of memory cells form a column, the first bit line being formed along a first side of the column, and the selection line being positioned along a second side of the column opposite to the first side.

8. The SRAM of claim 6, wherein the memory cell block further comprises a second plurality of the memory cells, each memory cell of the second plurality being coupled to a second bit line, wherein the second bit line is coupled to a second input/output line of the memory cell block via a second switch.

9. The SRAM of claim 6, comprising:
a first sub-array comprising a first of said memory cell blocks; and
a second sub-array comprising a second of said memory cell blocks, the first switch of each of the first and second memory cell blocks being controlled by the selection signal provided on said selection line.

10. The SRAM of claim 1, comprising:
a first sub-array comprising a plurality of the memory cells;
a second sub-array comprising a further plurality of the memory cells; and
one or more power supply circuits adapted to perform a partial activation of the SRAM by applying the second voltage difference to the memory cells of the first sub-array and applying a voltage lower than the second voltage difference to the memory cells of the second sub-array.

11. The SRAM of claim 1, wherein:
the first inverter comprises first and second transistors coupled in series via their main conducting nodes between the first and second power supply rails;
the second inverter comprises first and second transistors coupled in series via their main conducting nodes between the third and fourth power supply rails; and
the threshold voltage of the first transistor of the second inverter is larger than the threshold voltage of the first transistor of the first inverter, and/or the threshold voltage of the second transistor of the second inverter is larger than the threshold voltage of the second transistor of the first inverter.

12. The SRAM of claim 1, wherein the second inverter comprises first, second and third transistors coupled in series via their main conducting nodes between the third and fourth power supply rails, the first and second transistors or second and third transistors having their control nodes coupled together.

13. The SRAM of claim 1, wherein each SRAM cell further comprises a third and fourth transistors coupled in series by their main conducting nodes between the second power supply rail and a further bit line, a control node of the third transistor being coupled to an output of the second inverter, and wherein the SRAM further comprises a control circuit adapted to activate the first transistor of a first memory cell during a write operation to the first memory cell, and to activate the fourth transistor of the first memory cell during a read operation of the first memory cell.

14. A method of reading data from a memory cell of a static random access memory (SRAM), the SRAM comprising a plurality of memory cells each having a pair of cross-coupled inverters, a first of the inverters being supplied by first and second power supply rails and a second of the inverters being supplied by third and fourth supply rails, an input of the second inverter being coupled to a first bit line via a first transistor, the method comprising:
applying, during a read phase, a first voltage difference across the first and second power supply rails and a second voltage difference across the third and fourth power supply rails, the second voltage difference being greater than the first voltage difference.

\* \* \* \* \*

UNITED STATES PATENT AND TRADEMARK OFFICE
CERTIFICATE OF CORRECTION

PATENT NO. : 10,141,047 B2
APPLICATION NO. : 15/160968
DATED : November 27, 2018
INVENTOR(S) : Kiyoo Itoh, Amara Amara and Khaja Ahmad Shaik It is certified that error appears in the above-identified patent and that said Letters Patent is hereby corrected as shown below:

On the Title Page

Item (73) Assignee, should read as follows:
Commissariat à l'Energie Atomique et aux Energies Alternatives
Paris, France Signed and Sealed this
Seventeenth Day of September, 2019

Andrei Iancu
*Director of the United States Patent and Trademark Office*